United States Patent [19]

Maeba et al.

[11] Patent Number: 5,032,527
[45] Date of Patent: Jul. 16, 1991

[54] METHOD OF FORMING LEAD-OUT ELECTRODE PORTION OF PHOTOVOLTAIC DEVICE

[75] Inventors: Masayoshi Maeba; Nobuo Kadonome; Yoshinobu Takabatake, all of Hyogo, Japan

[73] Assignee: Sanyo Electric Co., Ltd., Osaka, Japan

[21] Appl. No.: 479,404

[22] Filed: Feb. 13, 1990

[30] Foreign Application Priority Data

Feb. 20, 1989 [JP] Japan ..................... 1-39935

[51] Int. Cl.$^5$ ............ H01L 31/18; H01L 31/05
[52] U.S. Cl. .......................... 437/2; 437/4; 136/244
[58] Field of Search .................. 437/2, 4–5, 437/51, 173, 205; 136/244

[56] References Cited

U.S. PATENT DOCUMENTS 4,518,815  5/1985  Yamazaki .................. 136/244
4,726,849  2/1988  Murata et al. .............. 136/244

FOREIGN PATENT DOCUMENTS

61-90475  5/1986  Japan ..................... 136/244

Primary Examiner—Aaron Weisstuch
Attorney, Agent, or Firm—W. G. Fasse; D. H. Kane, Jr.

[57] ABSTRACT

A method of forming a lead-out electrode in an integrated-type photovoltaic device including photoelectric conversion cells connected to each other in series on a transparent substrate is to form a lead-out electrode portion or section by separating a laminate of a semiconductor photo-active layer and a back electrode layer into back electrode and lead-out portions by means of a scanned laser beam. The major part of the lead-out electrode portion is elongated and has, at the opposite end, enlarged sections for receiving external lead wires or conductors. Accordingly, the lead-out electrode portion occupies only a small area in the substrate and can be formed easily by scanning with a laser beam.

18 Claims, 7 Drawing Sheets

METHOD OF FORMING LEAD-OUT ELECTRODE PORTION OF PHOTOVOLTAIC DEVICE

FIELD OF THE INVENTION

The present invention relates generally to a method for forming a lead-out electrode or electrodes for photovoltaic devices, and more particularly, a method for forming lead-out electrodes in an integrated-type photovoltaic device in which a plurality of photoelectric conversion cells neighboring each other are connected in series on a single substrate.

DESCRIPTION OF THE RELATED ART

In an integrated-type photovoltaic device, regions for connecting neighboring photoelectric conversion cells in series do not contribute to the generation of electricity. Accordingly, a method is desired by which these series connected regions can be formed to be as narrow as possible by means of a simple process. Therefore, a method of forming series connected regions in integrated-type photovoltaic devices by using a laser beam is described in, for example, U.S. Pat. No. 4,726,849 assigned to the same assignee of the present invention.

FIGS. 1A to 1E are schematic sectional views showing the method of forming series connected regions of an integrated-photovoltaic device disclosed in said U.S. Pat. No. 4,726,849. First, in the process shown in FIG. 1A, a transparent substrate 10 such as glass of about 1 to 5 mm in thickness and 10 cm by 10 cm to 50 cm by 50 cm in area is prepared. Then, a single layered or laminated multi-layer transparent conductive oxide (TCO) film of 2,000Å–5,000Å in thickness, typified by tin oxide (SnO$_2$) or indium tin oxide (ITO), is formed on one entire main surface of this substrate 10.

Figure 1A:
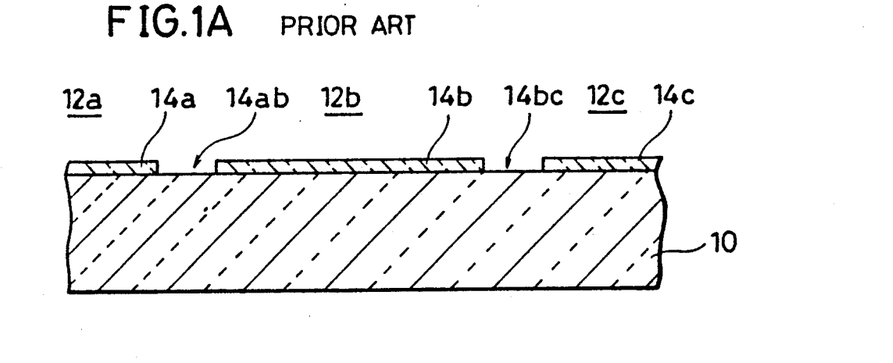
FIGS. 1A to 1E are sectional views showing the method for connecting a plurality of photoelectric conversion cells in series on a substrate according to the prior art.

Thereafter, a laser beam is directed onto interval portions 14ab, 14bc, corresponding to intervals between respective photoelectric conversion cells 12a, 12b, 12c, and the transparent electrode layers at these intervals are removed to form individual transparent electrodes 14a, 14b, 14c respectively. A laser device which generates a laser beam of a wavelength which is not significantly absorbed by the substrate 10 is suitable for this purpose. In the case where the substrate 10 is glass, a pulse-output type laser device of 0.35 μm–2.5 μm in wavelength is suitable. A Q-switched Nd:YAG laser of about 1.06 μm in wavelength, 13 J/cm$^2$ in energy density, and 3 KHz in pulse frequency may be employed.

Figure 1B:
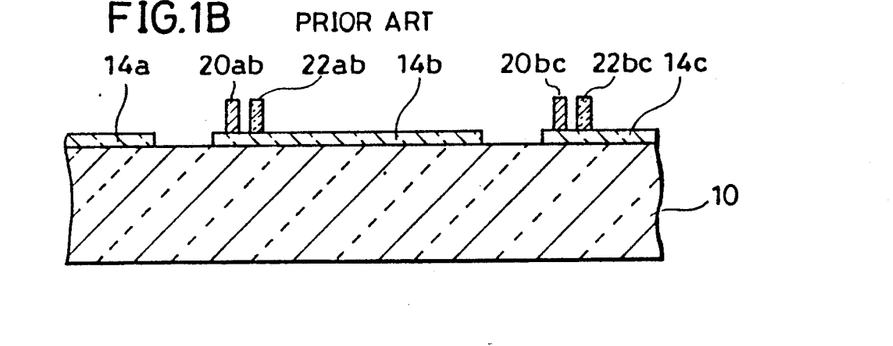

In the process shown in FIG. 1B, conductors 20ab, 20bc, and insulators 22ab, 22bc, are formed on the transparent electrodes 14b, 14c, in the vicinity of the interval portions 14ab, 14bc, between the transparent electrodes 14a, 14b, 14c, which are separated from one another. The conductors 20ab, 20bc are formed at the side near the adjacent interval portions 14ab, 14bc so as to extend in parallel to the length direction (perpendicular to the drawing sheet) of the photoelectric conversion cells 12a, 12b, 12c. Insulators 22ab, 22bc are spaced from the conductors 20ab, 20bc in the direction of width of the photoelectric conversion cells 12a, 12b, 12c. The insulators 22ab, 22bc are formed in the same manner as the conductors.

The conductors 20ab, 20bc, for example, are formed of silver paste or another low-temperature-fired type metal paste is used instead of silver paste. The insulators 22ab, 22bc are formed of a paste-like material which does not diffuse into an amorphous silicon film. The film is formed in a latter process and functions as a semiconductor photo-active layer. For example, SiO$_2$ paste and silicon dioxide (SiO$_2$) powder are formed into a paste, or another paste of inorganic material is selected.

The conductors 20ab, 20bc and the insulators 22ab, 22bc are both patterned to be 10–20 μm in height and 100–150 μm in width, for example, by a screen printing method and thereafter undergo a preliminary drying by being fired at a temperature of about 550° C.

The conductor paste and insulator paste can also be printed or formed, for example, by a pen-drawing method.

Figure 1C:
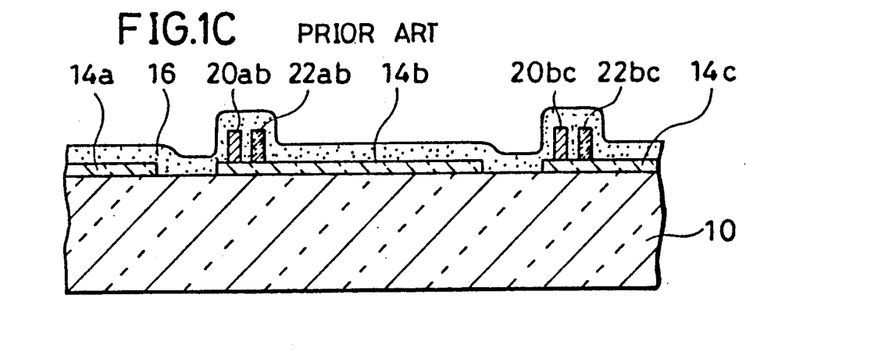

Next as shown in FIG. 1C, a semiconductor photo-active layer 16 is formed on nearly the entire main surface of the substrate 10 to cover the respective transparent electrodes 14a, 14b, 14c, the conductors 20ab, 20bc, and the insulators 22ab, 22bc. This semiconductor photo-active layer 16 is formed of an amorphous semiconductor, for example, amorphous silicon, and the film thickness thereof is selected to be in the range of 4,000Å–7,000Å so as to contribute effectively to the photoelectric conversion. The semiconductor photo-active layer 16 comprises, for example, a PIN junction parallel with the film surface.

Figure 1D:
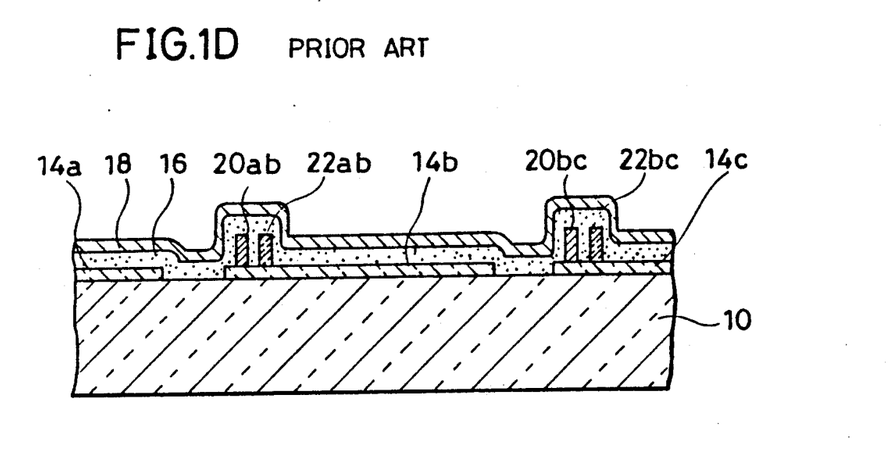

In the next process step as shown in FIG. 1D, a back electrode layer 18 having, for example, a film thickness of about 1000Å- 2 μm is formed over the semiconductor photo-active layer 16. A back electrode 18 is formed as a single-layer structure of aluminum, or as a double-layer laminate structure of aluminum and titanium, or a titanium-silver alloy, or as a dual structure including both double-layer structures in stacked fashion.

Figure 1E:
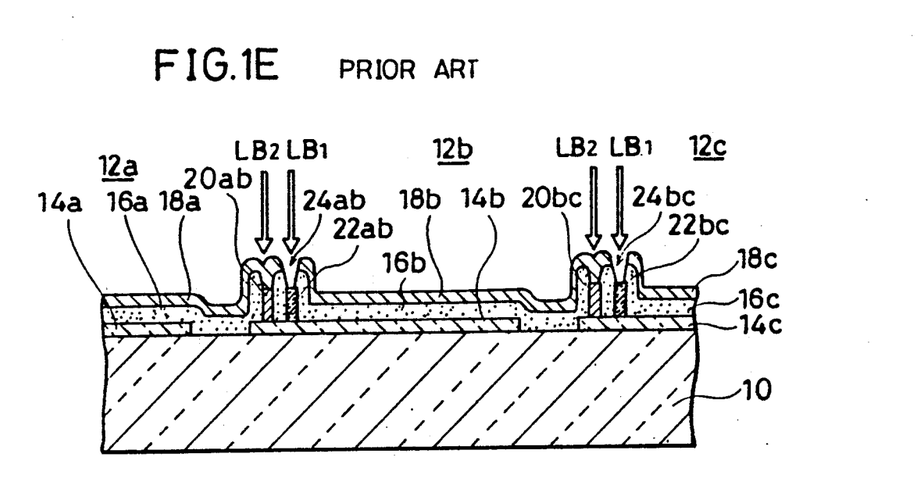

In the final process step shown in FIG. 1E, two laser beams LB1 and LB2 are directed onto the portion of the semiconductor photoactive layer 16 and back electrode 18 laminate located on the conductors 20ab, 20bc, and the insulators 22ab, 22bc, from the side of the back electrode 18.

The portions onto which the first laser beam LB1 is directed, are the portions to be removed so as to divide the laminate of the semiconductor photo-active layer 16 and the back electrode 18 corresponding to the respective photoelectric conversion cells 12a, 12b, 12c. These portions are positioned directly over the insulators 22ab, 22bc. Then, the energy density of the first laser beam LB1 is set to an energy density sufficient to remove those portions of the semiconductor photo-active layer 16 and back electrode 18 laminate. Even if the energy density of the laser beam LB1 is set at a higher level, the laser beam LB1 having such a high energy density reaches only the surfaces of the insulators 22ab, 22bc and never reaches the underlying transparent electrodes 14a, 14b, 14c, because of the presence of the insulators 22ab, 22bc, which are sufficiently thick beneath the above described laminated portion to protect the electrodes. Thus, the laminate of the semiconductor photo-active layer 16 and the back electrode 18 are separated completely, corresponding to the respective photoelectric conversion cells 12a, 12b, 12c, by the separating grooves 24ab, 24bc, formed therein by means of irradiation with the laser beam LB1.

On the other hand, the energy density of the second laser beam LB2 directed onto the conductors 20ab, 20bc, is set to a level sufficient to melt the portion of the semiconductor photo-active layer 16 and back electrode 18 laminate over the conductors 20ab, 20bc. Then, the silicide alloy produced by the melting, contacts the conductors 20ab, 20bc located beneath so as to penetrate the intervening semiconductor photo-active layer 16. As is described above, the conductors 20ab, 20bc, are metal conductors formed by sintering a silver paste or another metal paste, and therefore they are strongly bonded to the metal containing melt. Since these conductors 20ab, 20bc have a sufficient thickness or height, the underlying transparent electrodes 14b, 14c are not damaged by the second laser beam LB2.

After completion of the process step shown in FIG. 1E the adjacent back electrodes 18a, 18b, 18c and the transparent electrodes 14b, 14c of the respective photoelectric conversion cells 12a, 12b, 12c are connected electrically at the side nearer to the adjacent interval portions 14ab, 14bc (FIG. 1A) by means including the above described separating grooves 24ab, 24bc. Accordingly, the respective photoelectric conversion cells 12a, 12b, 12c are electrically connected in series through the back electrodes 18a, 18b, 18c, conductors 20ab, 20bc, and transparent electrodes 14b, 14c.

In such an integrated-type photovoltaic device as described above, formed on the same substrate, lead-out electrodes are required for taking out photovoltaic power. Each lead-out electrode is located next to one of opposite end cells in a plurality of photoelectric conversion cells connected in series on the substrate. Since it is necessary for the lead-out electrodes to contact external lead conductors, they are usually formed to be strip-like having a considerable width along the direction of length of the photoelectric conversion cells as shown in U.S. Pat. No. 4,518,815.

However, these lead-out electrodes are regions which do not contribute to the generation of electricity, as is also the case with the above described interval portions. Accordingly, a method is desired for forming lead-out electrodes which are as narrow as possible by means of a simple process.

SUMMARY OF THE INVENTION

In the light of the above described related art, it is an object of the present invention to provide a method of forming narrow lead-out electrodes in an integrated-type photovoltaic device by means of a simple process.

According to one aspect of the present invention, a method of forming lead-out electrodes in an integrated-type photovoltaic device including a plurality of photoelectric conversion cells connected in series on a transparent insulator substrate, comprises the following steps of: forming a plurality of transparent front electrodes separated from each other on the substrate, corresponding to the photoelectric conversion cells; forming an elongated conductor on and along one side of a first front electrode, at least one end portion of the elongated conductor being enlarged to a substantially right triangular shape; forming an elongated insulator along and adjacent to the inside edge of the elongated conductor on the first transparent electrode, at least one end portion of the elongated insulator ending with a short narrow segment along the hypotenuse of the right-triangle; forming a semiconductor photo-active layer on the substrate so as to cover the front electrode, the elongated conductor, and the elongated insulator; forming a back electrode on the semiconductor layer; scanning by relative movement of a first energy beam directed to the elongated insulator from above, the back electrode in order to separate lead-out electrode portions from the laminate of the back electrode and the semiconductor layer, the scanning by the first energy beam comprising a first scanning step at an approximately constant speed along the elongated insulator said first scanning step passing through the opposite end portions of said insulator, and a second scanning step having an approximately constant speed along the short narrow segment, said second scanning step passing through the opposite end portions of the narrow segment scanning by a first relative movement of a second energy beam directed to the elongated conductor from above the back electrode in order to connect the back electrode to the elongated conductor, said scanning by the second energy beam further comprising a second scanning movement at an approximately constant speed along the elongated conductor whereby the second energy beam passes through the opposite end portions of said elongated conductor.

According to another aspect of the present invention, a method of forming lead-out electrodes in an integrated-type photovoltaic device including a plurality of photoelectric conversion cells connected in series on a transparent insulator substrate comprises the following steps: forming a plurality of transparent front electrodes separated from each other on the substrate, corresponding to the photoelectric conversion cells; scanning by means of a first energy beam directed to a first transparent electrode in order to form narrow grooves for defining a transparent conductor island in the vicinity of one side of the first transparent electrode; forming an elongated conductor along said one side of the first transparent electrode, at least one portion of the elongated conductor being enlarged; forming an elongated insulator along and adjacent to the inside edge of the elongated conductor on the first transparent electrode, at least one portion of the elongated insulator having a short bent portion along the enlarged portion of the elongated conductor, the transparent conductor island being positioned under the bent portion of the elongated insulator; forming a semiconductor photo-active layer on the substrate so as to cover the front electrode, elongated conductor, and the elongated insulator; forming a back electrode layer on the semiconductor layer; scanning by relative movement of a second energy beam directed to the elongated insulator from above the back electrode layer in order to separate lead-out electrode portions from the laminate of the back electrode layer and the semiconductor layer, the second energy beam being moved at an approximately constant speed along the elongated insulator except for when the direction of the movement thereof is changed to enter the bent portion; scanning by relative movement of a third energy beam directed to the elongated conductor from above the back electrode layer in order to connect the back electrode layer with the elongated conductor, moving the third energy beam for scanning along the elongated conductor and through the opposite end portions of the elongated conductor at an approximately constant speed.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 2:
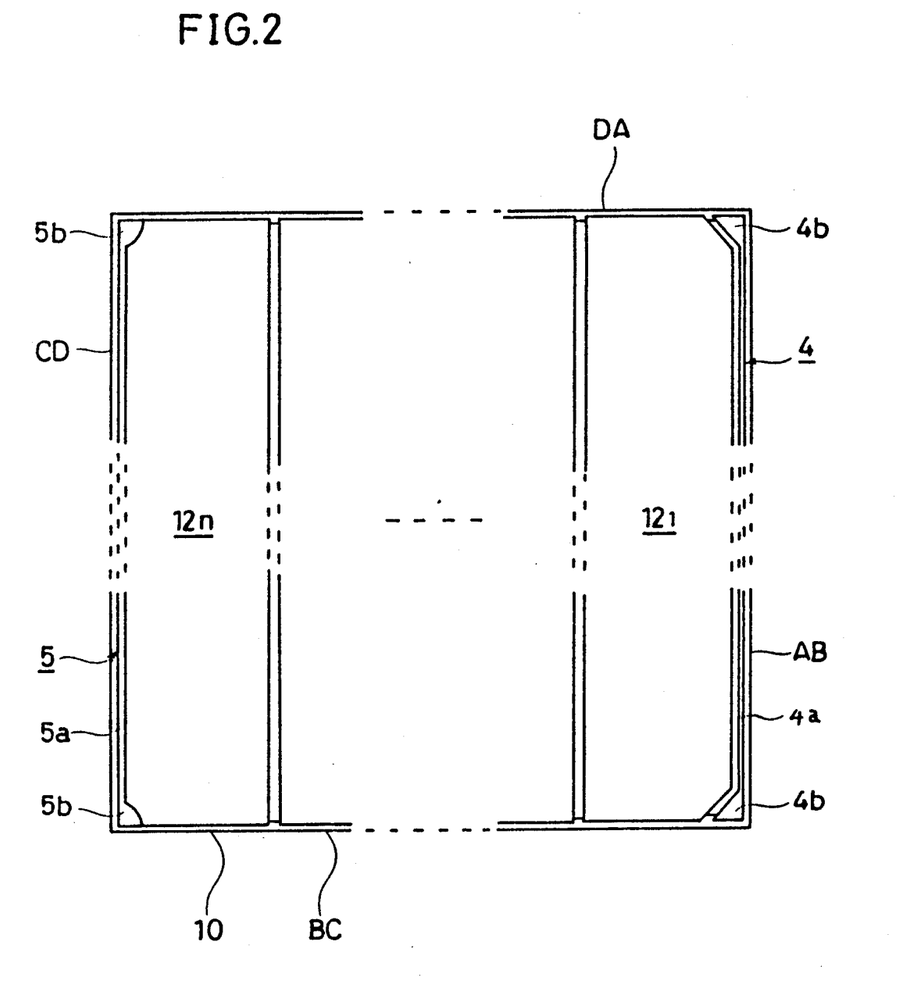
FIG. 2 is a plan view schematically showing an entire integrated-type photovoltaic device comprising lead-out electrodes formed according to the method of the present invention.

FIG. 2 shows an entire integrated-type photovoltaic device comprising lead-out electrodes formed by a method of the present invention. A plurality of first to n-th photoelectric conversion cells $12_1$–$12_n$ are formed on a transparent insulating substrate 10 such as glass and heat resistant plastics by cell separating intervals. The substrate 10 has a right side AB, a lower side BC, a left side CD and an upper side DA. The photoelectric conversion cells $12_1$–$12_n$ are connected electrically in series with each other at the intervals.

The first and the n-th photoelectric conversion cell $12_1$ and $12_n$ at opposite ends of the series connection, are connected electrically to first and second elongated lead-out electrodes 4 and 5, respectively. The first elongated lead-out electrode 4 includes an elongated stripe portion 4a provided between the right edge AB and the first photoelectric conversion cell $12_1$ of the substrate 10. The electrode portion 4a has at opposite ends thereof enlarged end sections 4b for forming a contact with external lead conductors. Similarly, the second elongated lead-out electrode 5 includes an elongated stripe portion 5a provided between the left side edge CD and the n-th photoelectric conversion cell $12_n$ on the substrate 10. The electrode portion 5a has at opposite ends thereof enlarged end sections 5b for forming a contact with external lead conductors. The photovoltaic power is taken out through the first and second lead-out electrodes 4 and 5.

Figure 3A:
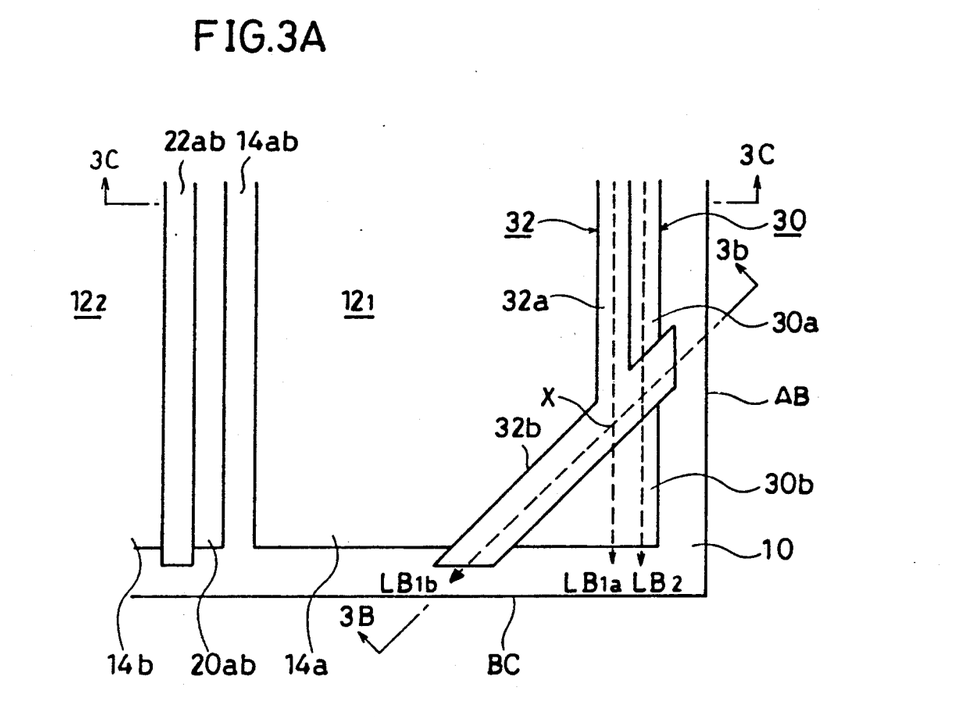
FIG. 3A is a partial plan view for explaining a method for forming a lead-out electrode according to a first embodiment of the present invention.
Figure 3B:
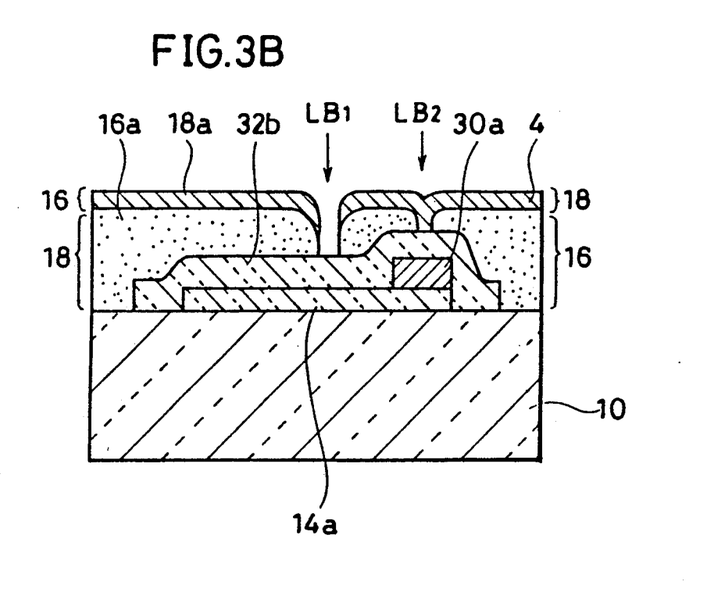
FIG. 3B is a sectional view taken along line 3B—3B in FIG. 3A.
Figure 3C:
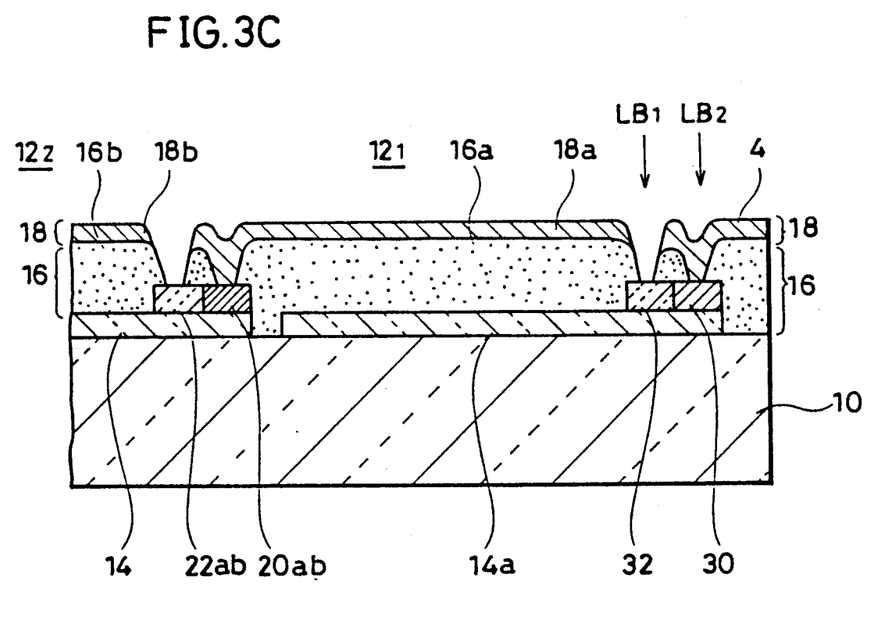
FIG. 3C is a sectional view taken along line 3C—3C in FIG. 3A.

FIG. 3A is a partial plan view for explaining a method for forming lead-out electrodes according to a first embodiment of the present invention and FIGS. 3B and 3C are sectional views taken along lines 3B—3B and 3C—3C in FIG. 3A, respectively. To simplify the drawing, semiconductor photo-active layer 16 and back electrode 18 are not shown in FIG. 3A. Referring to these drawings, a plurality of transparent front electrodes such as, 14a and 14b spaced apart from each other by intervals 14ab, are formed on the transparent insulating substrate 10 made of glass or heat resistant plastics, for example.

Conductor paste 30 is applied along a side nearer to the right edge AB of the substrate on the first transparent electrode 14a corresponding to the first photoelectric conversion cell $12_1$. The conductor paste 30 comprises a straight elongated stripe portion 30a parallel to the right edge AB and enlarged portions 30b of substantially right-triangular shape at the opposite ends of the stripes (FIG. 3A). The enlarged portions 30b are provided for later use as regions for connecting external lead conductors. In other words, the external conductors are connected to enlarged portions 30b, whereby the straight stripe portion 30a can be made narrow.

Insulator paste 32 is applied along the inside edge of the conductor paste 30 on the first transparent electrode 14a. The insulator paste 32 includes a straight elongated stripe segment 32a along the stripe portion 30a of the conductor paste. The insulator paste 32 also includes a straight short stripe segment 32b along the hypotenuse of the enlarged portion of the conductor paste having a substantially right-triangularly shaped configuration. As is clear from FIGS. 3A and 3B, the short segment 32b of the insulator paste covers a connection portion between the stripe portion 30a and the enlarged portion 30b of the conductor paste 30. A silver paste or other metal paste is used as the conductor paste 30 and an insulator paste, such as SiO$_2$ paste or other inorganic insulator material is used to form the insulator. The conductor paste 30 and the insulator paste 32 are preferably printed by a screen process to have a width within the range of 0.2–0.3 mm. Thereafter, the paste is baked at a temperature of 500°–550° C. The conductor paste 30 and the insulator paste 32 for connecting the first lead-out electrode 4 to the first photoelectric conversion cell $12_1$ are processed simultaneously with a conductor paste 20ab, etc. and an insulator paste 22ab, etc. for connecting the photoelectric conversion cells in series.

Then, a semiconductor photo-active layer 16 is formed on the substrate 10 so as to cover the baked conductors 30, and 20ab, etc., the insulators 32, 22ab, etc., and the transparent electrodes 14a, 14b, etc. to form a metal back electrode layer 18 on the semiconductor layer 16. Thereafter, the photoelectric conversion cells are connected in series, as described in conjunction with FIG. 1E.

On the other hand, in order to separate the first lead-out electrode 4 from the back electrode 18a of the first photoelectric conversion cell $12_1$, a scanning is performed by a first laser beam LB directed onto the insulator 32 from above the back electrode layer 18.

The scanning is performed by moving the substrate 10 relative to the laser beam, as indicated by a broken line arrow LB1a in FIG. 3A. The first laser beam LB1 is moved at an approximately constant speed from the upper side DA to the lower side BC of the substrate 10 along the stripe section 32a of the insulator 32 so as to pass through the enlarged portion 30b of the conductor 30. Then, as indicated by a broken line arrow LB1b, the first laser beam LB1 is moved at an approximately constant speed from the right side AB to the lower side BC of the substrate 10 along the short segment section 32b of the insulator 32, thereby electrically separating the first lead-out electrode 4 from the back electrode 18a of the first photoelectric conversion cell $12_1$. As can be seen in FIGS. 3A and 3B, since the insulator segment 32 crosses over and covers the elongated conductor 30, the conductor 30 is never damaged by the first laser beam.

If the movement of the substrate 10 is stopped when the first laser beam LB1, after being moved along the stripe section 32a of the insulator 32, meets the short segment section 32b, and then the direction in which the substrate is moved is changed such that the first laser beam LB1 moves toward the lower side BC along the section 32b, an intersection X between the stripe section 32a and the short segment section 32b of the insulator 32, is irradiated with the first laser beam for a long time period when the substrate 10 is stopped. Accordingly, the insulator 32 and even the transparent electrode 12a might be damaged at this intersection X. However, in the above described first embodiment, since the first laser beam never stops at the intersection X, no damage is caused at the intersection X.

In addition, in order to connect the first lead-out electrode 4 to the elongated conductor 30, scanning is performed by a second laser beam LB2 directed onto the conductor 30 from above the back electrode layer 18. The second laser beam LB2 is moved at an approximately constant speed from the upper side DA to the lower side BC of the substrate 10 along the stripe portion 30a of the conductor 30 so as to pass through the enlarged portion 30b, as indicated by the broken line arrow LB2 in FIG. 3A. As a result, as is clear from FIG. 3C, the first lead-out electrode 4 is connected electrically with the transparent front electrode 14a of the first photoelectric conversion cell 12l through the elongated conductor 30. The stripe portion 30a of the conductor 30 and the stripe portion 4a of the first lead-out electrode 4 serve as collector electrodes for collecting electric charges from the transparent electrode 14a having a relatively low conductivity and the enlarged portion 4b of the lead-out electrode 4 serves as a region for forming the contact with external lead-out conductors.

The laser beams LB1 and LB2 preferably have a width of 0.05–0.1 mm. In addition, the first laser beam LB1 preferably has an energy density higher than that of the second laser beam LB2. Furthermore, in the scanning by the laser beams LB1 and LB2, the second laser beam LB2 can be moved faster than the first laser beam LB1.

Referring again to FIG. 2, since the lead-out electrode 5 along the left side CD of the substrate 10 is to be connected electrically with a back electrode of the photoelectric conversion cell 12n at the left end, a part of the back electrode can be used, without being processed, as a second lead-out electrode. Thus, the photovoltaic power can be taken externally from the integrated-type photovoltaic device through the first and second lead-out electrodes 4 and 5. In addition, since the first narrow lead-out electrode portion occupies a small part of the main surface of the substrate 10, the effective area for photoelectric conversion can be increased. Furthermore, the first lead-out electrode portion can be formed easily by scanning with the laser beam.

Figure 4A:
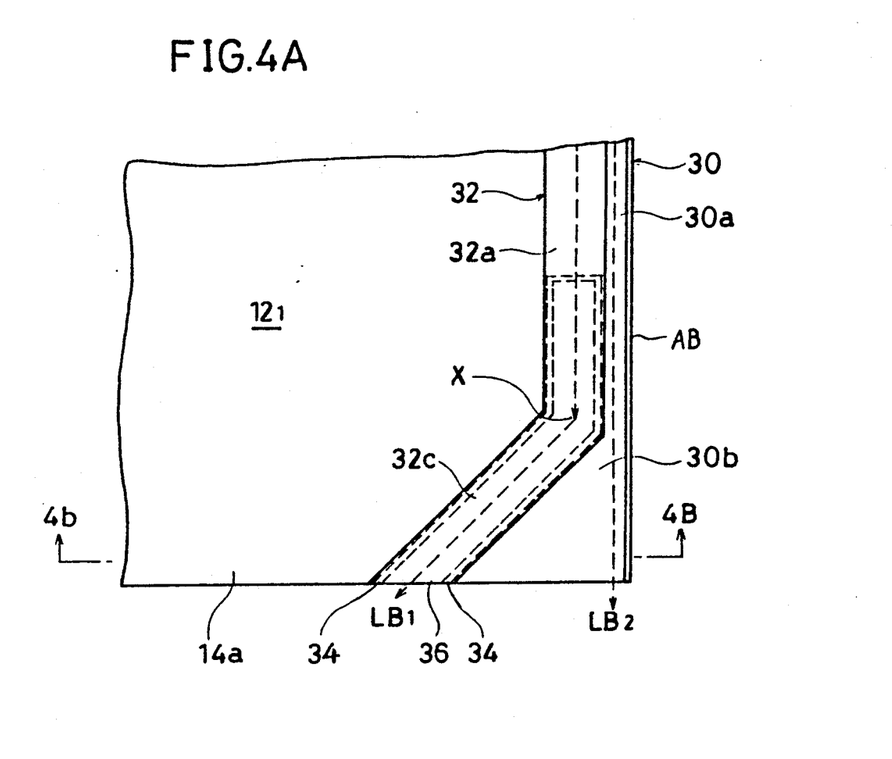
FIG. 4A is a partial plan view for explaining a method for forming a lead-out electrode according to a second embodiment of the present invention.
Figure 4B:
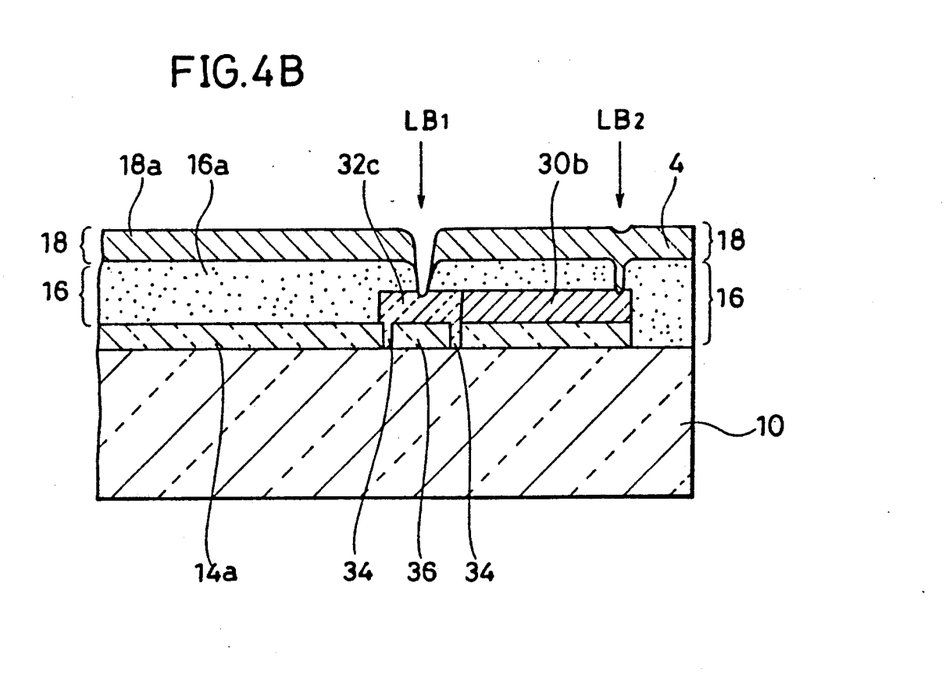
FIG. 4B is a sectional view taken along line 4B—4B in FIG. 4A.

FIG. 4A is a partial plan view for explaining a method for forming lead-out electrode portions according to a second embodiment and FIG. 4B is a sectional view taken along a line 4B—4B in FIG. 4A. To clarify the drawing, the semiconductor photo-active layer 16 and the back electrode layer 18 are not shown in FIG. 4A. Although the second embodiment is similar to the first embodiment, the first transparent electrode 14 and the elongated insulator 32 are partially modified in the second embodiment.

After the formation of the transparent electrode 14a on the substrate 10, grooves 34 are formed by using a laser beam, thereby separating a transparent conductor island 36 including a bend point X, from the transparent electrode 14a. Then, an elongated conductor 30 and an elongated insulator 32 are formed. The elongated insulator 32 has a short bend section 32c instead of the short segment 32b. The transparent conductor island 36 is covered with the elongated insulator 32 and the grooves 34 are filled preferably with the insulator 32.

Then, as in the first embodiment, a semiconductor photo-active layer 16 and a metal back electrode layer 18 are formed. The groove 34 may be filled with the semiconductor layer 16 instead of the insulator 32.

In the scanning by the first laser beam LB1 to electrically separate the first lead-out electrode 4 from the back electrode 18a of the first photoelectric conversion cell 12l, relative movement of the first laser beam LB1 along the elongated insulator 32 is bent at the point X, as indicated by the broken line arrow LB1 in FIG. 4A. More specifically, when the first laser beam LB1 reaches the point X, the substrate 10 is stopped, and then, the substrate 10 is moved in a direction along the bent section 32c of the insulator. On this occasion, at the point X where relative movement of the first laser beam is stopped, a hole might be formed which penetrates the elongated insulator to reach the transparent conductor island 36. However, the transparent conductor island 36 is separated electrically from the transparent electrode 14a through the grooves 34, so that no inconvenience is caused.

Thereafter, similarly as in the first embodiment, the first lead-out electrode 4 is connected electrically to the elongated conductor 30 by using the second laser beam LB2.

Figure 5:
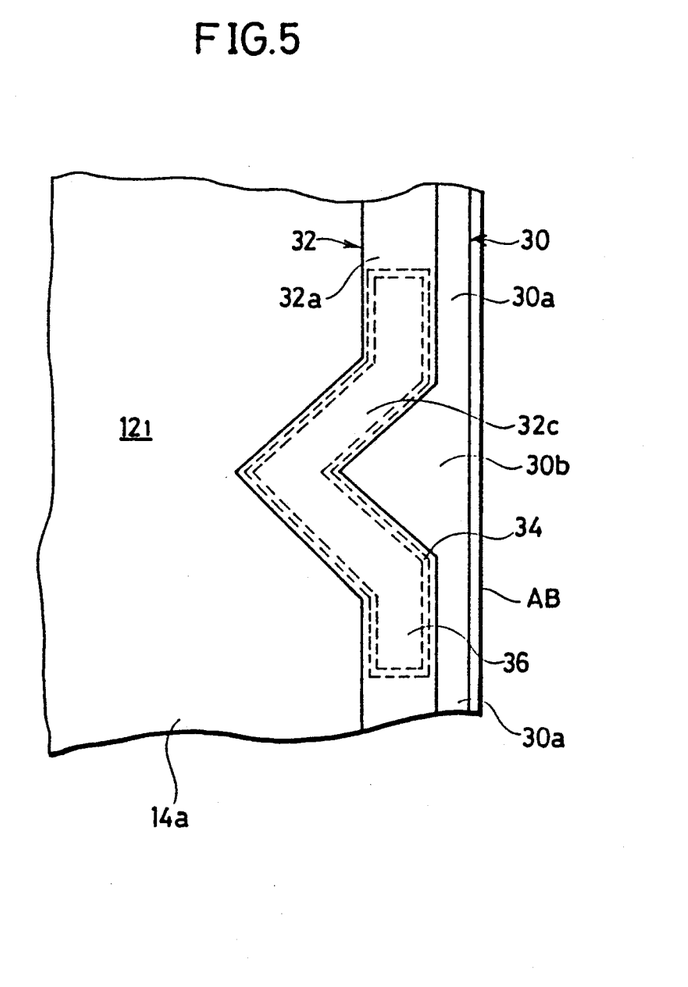
FIG. 5 is a partial plan view for explaining a method for forming a lead-out electrode according to a third embodiment of the present invention.

Referring to FIG. 5, there is illustrated a third embodiment of the invention which is similar to the second embodiment except that the short bent portion 32c of the elongated insulator 32 is formed not at the end portion but at an intermediate portion of the elongated insulator 32.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of forming a lead-out electrode in an integrated-type photovoltaic device including a plurality of photoelectric conversion cells connected in series on a transparent insulator substrate, comprising the following steps: forming a plurality of transparent front electrodes separated from each other on said substrate, corresponding to said photoelectric conversion cells, forming an elongated conductor on and along one side of a first one of said front electrodes, at least one end portion of said elongated conductor being enlarged to a substantially right-triangular shaped configuration, forming an elongated insulator along and adjacent to the inside edge of said elongated conductor on said first transparent electrode, at least one end portion of said elongated insulator ending with a short narrow segment along the hypotenuse of said right-triangular shaped configuration, forming a semiconductor photo-active layer on said substrate so as to cover said front electrode, said elongated conductor and said elongated insulator, forming a back electrode layer on said semiconductor layer, scanning by relative movement of a first energy beam directed to said elongated insulator from above said back electrode layer for separating a lead-out electrode portion from the laminate of said back electrode layer and said semiconductor layer, said scanning by said first energy beam comprising a first scanning step at an approximately constant speed along said elongated insulator passing through the opposite end portions of said elongated insulator and a second scanning step at an approximately constant speed along said short narrow segment, said second scanning step passing through the opposite end portions of said short narrrow segment, further scanning by a first relative scanning movement of a second energy beam directed to said elongated conductor from above said back electrode layer for connecting said back electrode layer to said elongated conductor, said further scanning by said second energy beam comprising a second scanning movement at an approximately constant speed along said elongated conductor whereby said second energy beam passes through the opposite end portions of said elongated conductor.

2. The method according to claim 1, wherein said elongated conductor is selected to have a conductivity higher than that of said transparent front electrodes.

3. The method according to claim 1, wherein said back electrode is formed as a metallic electrode layer.

4. The method according to claim 1, wherein said elongated conductor is formed by baking a conductor paste.

5. The method according to claim 4, wherein said conductor paste is printed by a screen process.

6. The method according to claim 1, wherein said elongated insulator is formed by baking an insulator paste.

7. The method according to claim 6, wherein said insulator paste is printed by a screen process.

8. The method according to claim 1, wherein said first energy beam has an energy density higher than that of said second energy beam.

9. The method according to claim 1, wherein said second energy beam is moved at a speed higher than that of said first energy beam.

10. A method of forming a lead-out electrode in an integrated type photovoltaic device including a plurality of photoelectric conversion cells connected in series on a transparent insulator substrate, comprising the following steps: forming a plurality of transparent front electrodes separated from each other on said substrate, corresponding to said photoelectric conversion cells, scanning by means of a first energy beam directed to a first transparent electrode for forming narrow grooves for defining a transparent conductor island in the vicinity of one side of said first transparent electrode, forming an elongated conductor on and along said one side of said first transparent electrode, at least one portion of said elongated conductor being enlarged, forming an elongated insulator along and adjacent to the inside edge of said elongated conductor on said first transparent electrode, at least one portion of said elongated insulator having a short bent portion along said enlarged portion of said elongated conductor, said transparent conductor island being positioned under said bent portion of said elongated insulator, forming a semiconductor photo-active layer on said substrate for covering said transparent electrode, said elongated conductor and said elongated insulator, forming a back electrode layer on said semiconductor layer, scanning by means of relative movement of a second energy beam directed to said elongated insulator from above said back electrode layer for separating a lead-out electrode portion from the laminate of said back electrode layer and said semiconductor layer, said second energy beam being moved at an approximately constant speed along said elongated insulator except for when the direction of the movement thereof is changed to enter said bent portion, scanning by means of a relative movement of a third energy beam directed to said elongated conductor from above said back electrode for connecting said back electrode layer with said elongated conductor, said third energy beam being scanned along said elongated conductor and through the opposite end portions thereof at an approximately constant speed.

11. THe method according to claim 10, wherein said elongated conductor is selected to have a conductivity higher than that of said transparent front electrode.

12. The method according to claim 10, wherein said back electrode layer is formed as a metallic electrode layer.

13. The method according to claim 10, wherein said elongated conductor is formed by baking a conductor paste.

14. The method according to claim 13, wherein said conductor paste is printed by a screen process.

15. The method according to claim 10, wherein said elongated insulator is formed by baking an insulator paste.

16. The method according to claim 14, wherein said insulator paste is printed by a screen process.

17. The method according to claim 10, wherein said second energy beam has an energy density higher than that of said third energy beam.

18. The method according to claim 10, wherein said third energy beam is moved at a speed faster than that of said second energy beam.

* * * * *